United States Patent
Etter et al.

(10) Patent No.: US 9,670,571 B2
(45) Date of Patent: Jun. 6, 2017

(54) METHOD FOR MANUFACTURING COMPONENTS MADE OF SINGLE CRYSTAL (SX) OR DIRECTIONALLY SOLIDIFIED (DS) NICKELBASE SUPERALLOYS

(71) Applicant: ALSTOM Technology Ltd, Baden (CH)

(72) Inventors: Thomas Etter, Muhen (CH); Roland Mücke, Windisch (CH)

(73) Assignee: ANSALDO ENERGIA IP UK LIMITED, London (GB)

( * ) Notice: Subject to any disclaimer, the term of this patent is extended or adjusted under 35 U.S.C. 154(b) by 217 days.

(21) Appl. No.: 14/493,885

(22) Filed: Sep. 23, 2014

(65) Prior Publication Data

US 2015/0013852 A1 Jan. 15, 2015

Related U.S. Application Data

(63) Continuation of application No. PCT/EP2013/056028, filed on Mar. 22, 2013.

(30) Foreign Application Priority Data

Mar. 27, 2012 (EP) ...................... 12161539

(51) Int. Cl.
| | |
|---|---|
| *C22F 1/10* | (2006.01) |
| *F01D 5/14* | (2006.01) |
| *C30B 29/52* | (2006.01) |
| *C22C 19/00* | (2006.01) |

(52) U.S. Cl.
CPC ................ *C22F 1/10* (2013.01); *C22C 19/00* (2013.01); *C30B 29/52* (2013.01); *F01D 5/14* (2013.01); *C21D 2201/04* (2013.01); *C21D 2261/00* (2013.01); *F05D 2300/606* (2013.01); *F05D 2300/607* (2013.01)

(58) Field of Classification Search
None
See application file for complete search history.

(56) References Cited

U.S. PATENT DOCUMENTS

| | | | | |
|---|---|---|---|---|
| 3,850,702 | A * | 11/1974 | Buchanan | ................ B22F 3/24 257/E21.123 |
| 4,582,548 | A | 4/1986 | Harris et al. | |
| 4,885,216 | A * | 12/1989 | Naik | ..................... C22C 19/056 148/404 |
| 4,921,405 | A | 5/1990 | Wilson | |

(Continued)

FOREIGN PATENT DOCUMENTS

| | | |
|---|---|---|
| EP | 0 246 082 A1 | 11/1987 |
| EP | 1 184 473 A2 | 3/2002 |

*Primary Examiner* — George Wyszomierski
(74) *Attorney, Agent, or Firm* — Buchanan Ingersoll & Rooney PC

(57) ABSTRACT

The invention relates to a method for manufacturing a component, especially of a gas turbine, made of a single crystal (SX) or directionally solidified (DS) nickelbase superalloy, including a heat treatment and a machining and/or mechanical treatment step. The ductility of the component is improved by doing the machining and/or mechanical treatment step prior to said heat treatment and a solution heat treatment of the component is done prior to the machining/mechanical treatment step.

13 Claims, 6 Drawing Sheets

(56) References Cited

U.S. PATENT DOCUMENTS

| | | | | |
|---|---|---|---|---|
| 4,981,528 | A | * | 1/1991 | Fritzemeier ............... C22F 1/10 148/410 |
| 5,074,925 | A | * | 12/1991 | Gostic ....................... C22F 1/10 148/404 |
| 5,302,217 | A | * | 4/1994 | Gostic ....................... C22F 1/10 148/410 |
| 5,451,142 | A | | 9/1995 | Cetel et al. |
| 7,156,932 | B2 | * | 1/2007 | Cao ....................... C22C 19/056 148/675 |
| 2007/0227630 | A1 | * | 10/2007 | Augustins Lecallier ............... C22C 1/0433 148/428 |

* cited by examiner

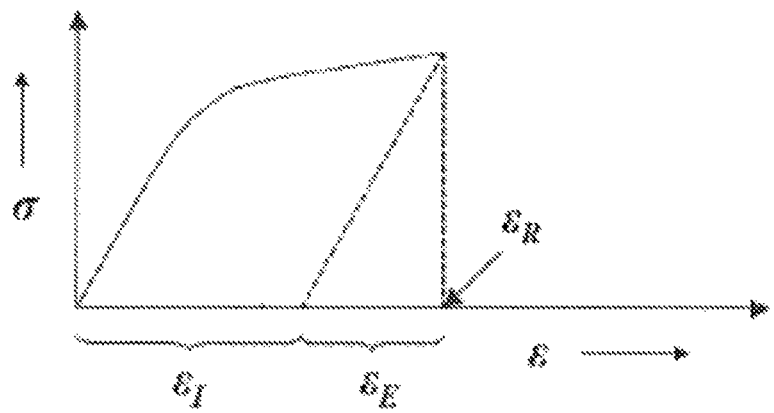
FIG. 1
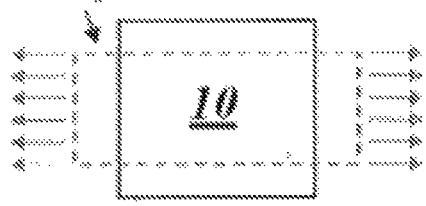
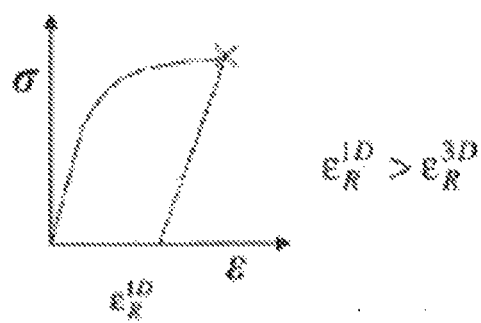
FIG. 2A
FIG. 2B

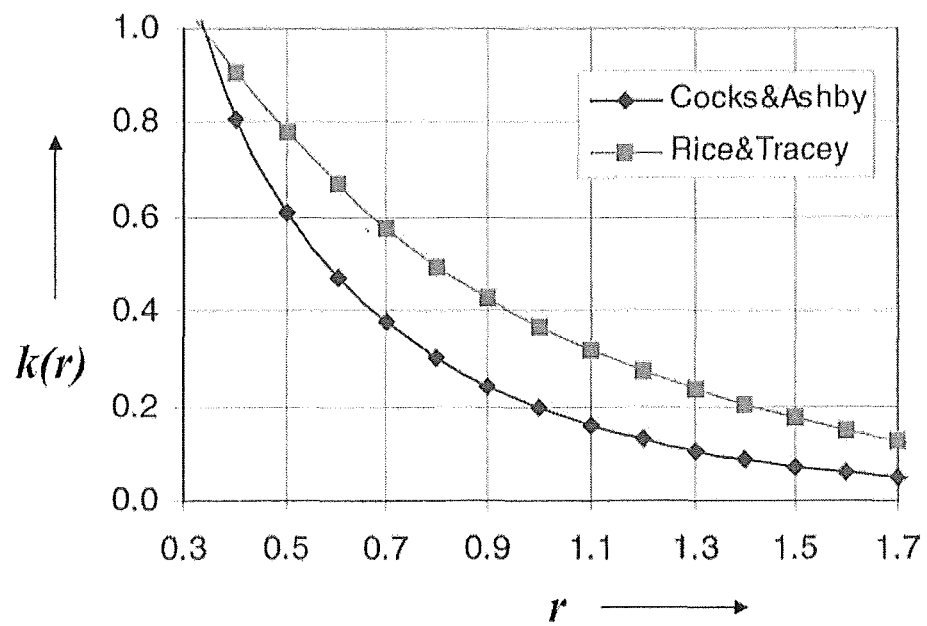
*Fig.4*
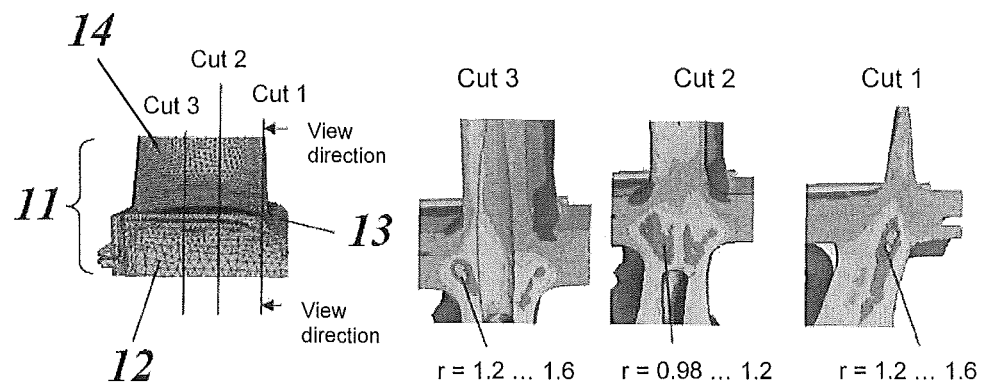
*Fig.5*   *Fig.6*

METHOD FOR MANUFACTURING COMPONENTS MADE OF SINGLE CRYSTAL (SX) OR DIRECTIONALLY SOLIDIFIED (DS) NICKELBASE SUPERALLOYS

CROSS-REFERENCE TO RELATED APPLICATIONS

This application claims priority to PCT/EP2013/056028 filed Mar. 22, 2013, which claims priority to European application 12161539.7 filed Mar. 27, 2012, both of which are hereby incorporated in their entireties.

TECHNICAL FIELD

The present invention relates to the technology of nickelbase superalloys. It refers to a method for manufacturing a component, especially of a gas turbine, made of a single crystal (SX) or directionally solidified (DS) nickelbase superalloy, according to the preamble of claim 1.

BACKGROUND

The ductility (deformability) of single crystal (SX) and directionally solidified (DS) superalloys is lower than in conventionally cast (CC) parts. In regions of high multiaxiality, the low ductility of SX and DS materials is further reduced (see below).

On the other hand, the thermo-mechanical loading of turbine blades requires a certain degree of ductility (deformability) due to thermal strains and high mechanical loads.

The rupture strain $\epsilon_R$ is a material limit for describing the ductility (deformability) of the material. For a safe design, the rupture strain has to exceed the mechanical strain in the design defined by the sum of the inelastic strain $\epsilon_I$ and the elastic strain $\epsilon_E$, as shown in FIG. 1.

The rupture strain is influenced by the multiaxiality of the material. For a uniaxial 1D state of stress (see the component 10 in FIG. 2(a)) the Poisson effect leads to a fairly high rupture strain $\epsilon_R^{1D}$ (FIG. 2(b)). A multiaxial 3D state of stress reduces (or even prevents) the Poisson effect, i.e. the deformability of a multiaxial stress state is only obtained by the elastic volume change, FIG. 3(a). Moreover, several damage mechanisms like the growth of creep pores are significantly affected by multiaxiality so that the rupture strain $\epsilon_R^{3D}$ in this case is substantially reduced (FIG. 3(b)).

In literature, the influence of multiaxiality on ductility is described by the stress ratio $$r = \frac{\sigma_H}{\sigma_{Mises}} \quad (1)$$

where $\sigma_H = \frac{1}{3}(\sigma_{11}+\sigma_{22}+\sigma_{33})$ is the hydrostatic stress and $$\sigma_{Mises} = \sqrt{\frac{3}{2}\sigma_{ij}^{dev}\sigma_{ij}^{dev}}$$

is the von Mises stress where $\sigma_{ij}^{dev}=\sigma_{ij}-\sigma_H\delta_{ij}$ denotes the stress deviator. The reduction of ductility is then described by the correction factor $$k(r) = \frac{\epsilon_R^{3D}}{\epsilon_R^{1D}}, \quad (2)$$

where $$k(r) = 1.65\exp\left(-\frac{3}{2}r\right) \quad (3)$$

according to Rice and Tracey, and $$k(r) = \frac{\sinh\left(\frac{2}{3}\left(\frac{n-0.5}{n+0.5}\right)\right)}{\sinh\left(2r\left(\frac{n-0.5}{n+0.5}\right)\right)} \quad (4)$$

according to Cocks and Ashby, with $n\to\infty$ for rigid plastic deformation. Both models predict a considerable reduction of the deformability of the material due to multiaxiality (see FIG. 4).

FIG. 5 shows a central part of a gas turbine blade 11, which comprises a root 12, a platform 13 and an airfoil 14. Three different cuts 1-3 through said central part are shown in FIG. 6 with the corresponding distribution of the stress ratio r. As can be seen from FIG. 6, the multiaxiality of thick regions in turbine blades reaches values up to r=1.6. This corresponds to a reduction of the uniaxially measured ductility down to 15% using the Rice & Tracey model and 6% using the Cocks & Ashby model, respectively (FIG. 4).

Considering that the loading of turbine blades (due to pressure and centrifugal loads and non-even temperature distributions) produces mechanical strains in the order of up to 1%, a considerable ductility of the material is required.

The document U.S. Pat. No. 5,451,142 describes a method to provide a layer/coating of a high strength polycrystalline superalloy bonded to the root of a nickelbase superalloy turbine blade. This layer is plasma sprayed onto the fir tree of the blade.

The document U.S. Pat. No. 4,921,405 teaches a single crystal turbine blade having a portion of its attachment section (fir tree) layered with a fine grained polycrystalline alloy. According to the teaching, the layering is preferably accomplished by plasma spraying of the attachment section with a superalloy and hot isostatically compacting the sprayed superalloy to minimum porosity. The resulting turbine blade should have improved life resulting from the reduced low cycle, low temperature fatigue susceptibility of, and crack growth in, the composite attachment section.

In both cases, a special coating process has to be applied during manufacturing of the blade, which requires substantial additional time and cost efforts.

U.S. Pat. No. 4,582,548 describes a single crystal casting alloy for use in a gas turbine engine. Single crystal solid blades or bars were cast and machined in the longitudinal direction. After machining they were solutioned and then pseudocoated and aged. EP 1184473 A2 discloses Nickelbase single-crystal superalloys and a method of manufacturing the same. The method is similar to the one described in U.S. Pat. No. 4,582,548, the solution heat treatment of the specimen/component and the additional heat treatment steps are done after a machining step.

SUMMARY

It is an object of the present invention to disclose a method for manufacturing components, especially of a gas turbine, made of Single Crystal (SX) or Directionally Solidified (DS) nickelbase superalloys, which results in the necessary strength of the component without causing additional effort.

This and other objects are obtained by a method according to claim 1.

The inventive method for manufacturing a component, especially of a gas turbine, made of a single crystal (SX) or directionally solidified (DS) nickelbase superalloy, comprises a heat treatment and a machining and/or mechanical treatment step. The machining/mechanical treatment step is done prior to said heat treatment, but after a solution heat treatment of the component was done.

The machining step comprises for example a milling step or a grinding step and the mechanical treatment step could be a shot peening.

According to a first embodiment of the invention the heat treatment comprises a plurality of heat treatment steps.

Especially, the heat treatment comprises three heat treatment steps with successively reduced temperatures.

According to another embodiment of the invention said heat treatment steps take place at temperatures below the γ' (gamma prime) solvus temperature of the component material.

According to the further embodiment of the invention selected surfaces of the component are mechanically deformed/treated after the machining step and prior to said heat treatment, that a first heat treatment step at an elevated temperature, but below γ' (gamma prime) solvus temperature is done, that an additional coating is applied to said surfaces, and that a coating diffusion heat treatment step and a precipitation heat treatment step is done thereafter.

BRIEF DESCRIPTION OF THE DRAWINGS

The present invention is now to be explained more closely by means of different embodiments and with reference to the attached drawings.

FIG. 1 shows the rupture strain in a stress-strain diagram;
FIG. 2A shows the uniaxial loading of a component and FIG. 2B shows the corresponding stress-strain diagram;
FIG. 4 shows the reduction of ductility due to multiaxial stress according to 2 different models;
FIG. 5 shows a central part of a gas turbine blade;
FIG. 6 shows the distribution of the stress ratio r in three different cut planes of the blade according to FIG. 5.

DETAILED DESCRIPTION

The present invention is based on investigations comprising tensile tests of specimens made of a nickelbase superalloy, which have seen different combinations of surface and heat treatments. In particular, it was successfully tried to modify the surface in a way that a subsequent heat treatment results in the formation of a ductile layer. That has been achieved by a heat treatment below the γ' (gamma prime) solvus temperature, resulting in a coarse γ/γ' (gamma/gamma prime) microstructure (cellular recrystallisation) in the outermost area.

The impact of surface layer modification on tensile ductility has been observed on SX tensile specimens.

Figure 3A:
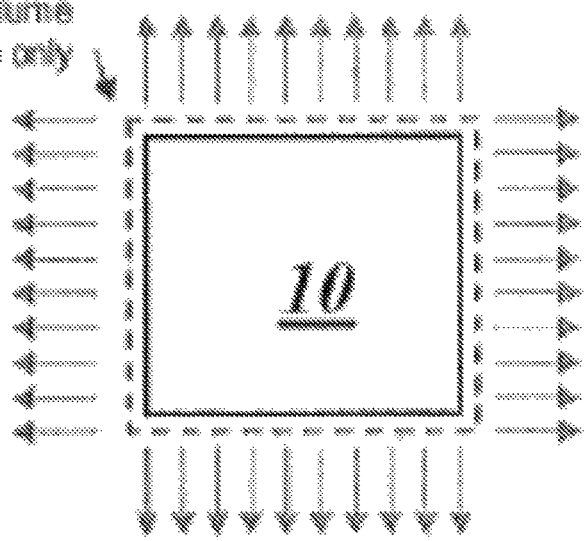
FIG. 3A shows the multiaxial loading of a component and FIG. 3B shows the corresponding stress-strain diagram with its reduced rupture strain.
Figure 3B:
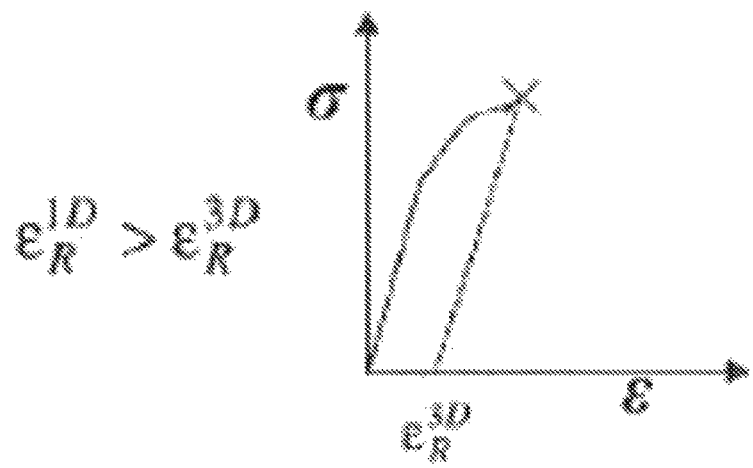
Figure 7:
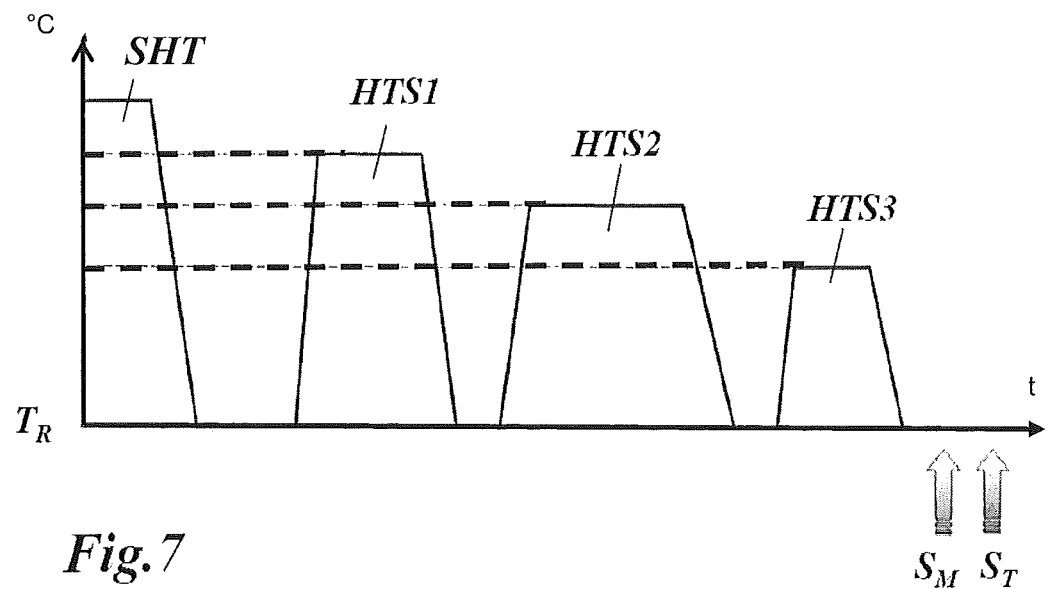
FIG. 7 shows an exemplary manufacturing procedure for a gas turbine component according to the prior art.

FIG. 7 shows a (prior art) "reference" procedure where a heat treatment T(t) with 3 different heat treatment steps HTS1-3 has been done first on test bars and final machining (machining step $S_M$) and testing (testing step $S_T$) of the specimens has been done after heat treatment (specimen Z6 in Table 1).

Figure 9:
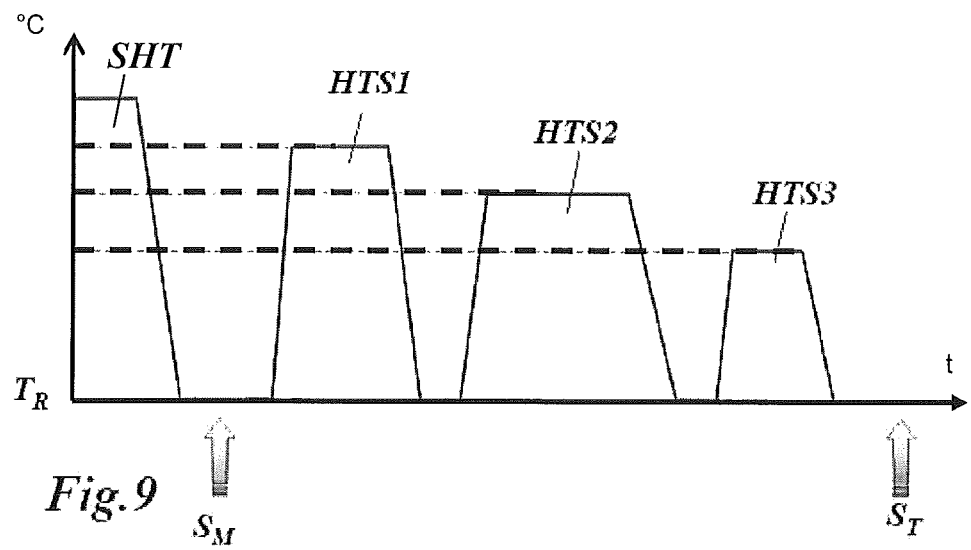
FIG. 9 shows in a diagram similar to FIG. 7 an embodiment of the manufacturing method according to the present invention.

In contrast, according to FIG. 9, plastic deformation and machining of the final specimen geometry (machining step $S_M$) has been done before the heat treatment (heat treatment steps HTS1-3) (specimen Z1 in Table 1), but after the solution heat treatment. Thereby, the surface near region, previously affected by plastic deformation and machining (e.g. by cold work hardening, for instance) was modified by the heat treatment.

TABLE 1

| Specimen | Plastic Deformation | Yield strength | Tensile strength | Elongation after fracture |
|---|---|---|---|---|
| Z6 (acc. FIG. 7) | None | 966 MPa | 1061 MPa | 4.3% |
| Z1 (acc. FIG. 9) | 0.26% | 948 MPa | 1299 MPa | 13.1% |

Figure 8:
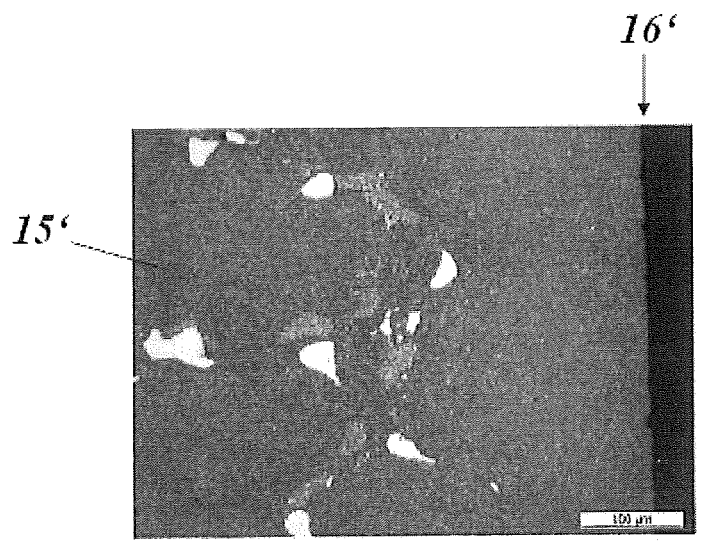
FIG. 8 shows a micrograph of a body manufactured according to the prior art procedure of FIG. 7.
Figure 10:
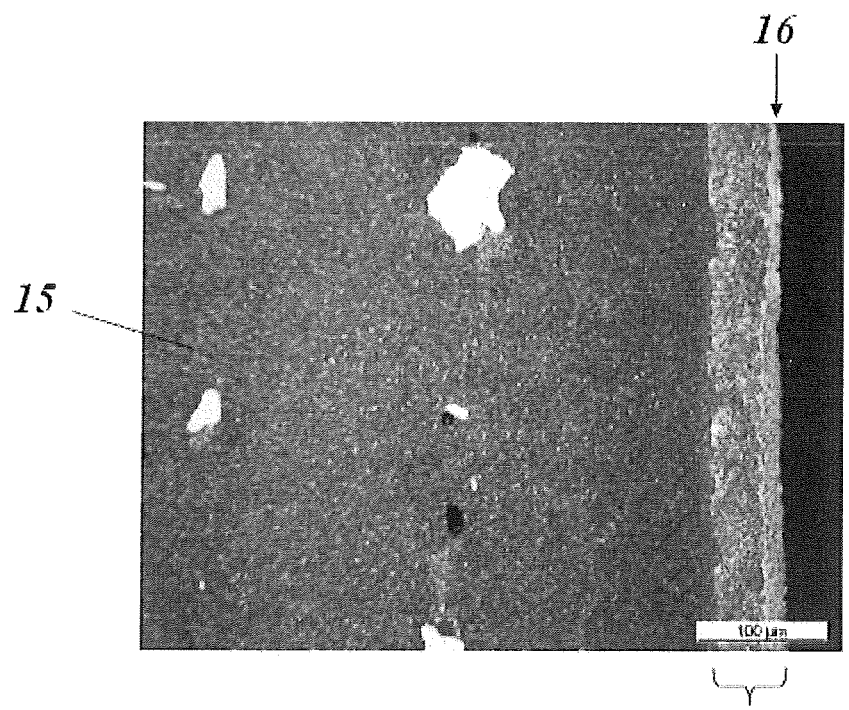
FIG. 10 shows a micrograph of a body manufactured according to the procedure of FIG. 9
Figure 11:
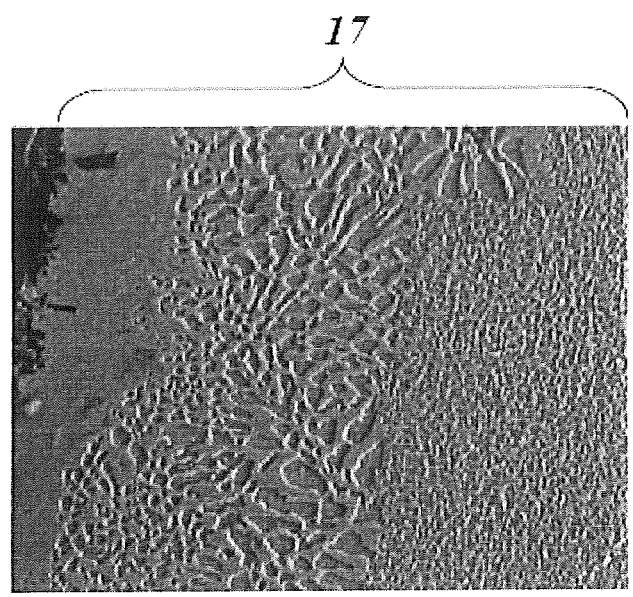
FIG. 11 shows the coarse γ/γ' microstructure with its cellular recrystallisation of the body according to FIG. 10.

According to Table 1, significant higher ductility was achieved due to previous surface treatment (plastic deformation) in specimen Z1 compared to specimen Z6. The modified surface layer 17 of specimen 15 (Z1) just below the surface 16 is shown in FIGS. 10 and 11. For comparison, the un-affected surface area at the surface 16' of specimen 15' (Z6) is shown in FIG. 8.

The effect of increased ductility on SX components has also been observed on other specimens at room temperature $T_R$ as well as at 600° C. even without previous plastic deformation, only due to the specimen machining step $S_M$.

Table 2 shows the results for 4 different specimen with specimen 1A and 1B having been machined after a heat treatment (HTS1, HTS2, HTS3) procedure according to FIG. 7 while specimen 2A and 2B were machined before a heat treatment HTS1, HTS2, HTS3) procedure according to FIG. 9

TABLE 2

| Specimen | Testing temperature | Yield strength | Tensile strength | Elongation after fracture |
|---|---|---|---|---|
| 1A | 23° C. | 832 MPa | 870 MPa | 9.1% |
| 1B | 600° C. | 805 MPa | 959 MPa | 6.4% |
| 2A | 23° C. | 805 MPa | 864 MPa | 20.9% |
| 2B | 600° C. | 751 MPa | 935 MPa | 16.3% |

Again, significant higher ductility values were achieved in specimens 2A/2B compared to specimen 1A/1B.

A potential heat treatment sequence for increased ductility in the attachment area (fir tree) and/or areas of multiaxiality of a gas turbine blade could be as follows:
 a) solution heat treatment of the blade at casting house
 b) machining of fir tree
 c) mechanical treatment (for example shot peening) of the fir tree and/or inner surfaces of cooling channel d) heat treatment at elevated temperature, but below γ' (gamma prime) solvus temperature (e.g. during brazing heat treatment)
e) application of an additional coating for the airfoil;
f) coating diffusion heat treatment and precipitation heat treatment.

The characteristics of the present invention are:

Turbine parts require a sufficient ductility of the material for carrying structural loads.

SX (or DS) materials have typically a low ductility, which is on the limit for turbine blade applications.

The SX (or DS) ductility can be improved by changing the sequence of machining and heat treatment.

The invention claimed is:

1. A method for manufacturing a component comprised of a nickelbase superalloy, the nickelbase superalloy being one of: single crystal (SX) and directionally solidified (DS), the method comprising:
   heating the component in a first heat treatment to a temperature below a gamma prime solvus temperature of the component, the first heat treatment comprising solution heat treatment;
   machining at least one portion of the component after the first heat treatment;
   mechanically treating the component after the first heat treatment;
   heating the component in a second heat treatment after the machining and after the mechanically treating, the second heat treatment heating the component to a temperature that is below a gamma prime solvus temperature;
   applying a coating onto at least one portion of the component;
   performing a third heat treatment on the component after the coating is applied, the third heat treatment comprising at least one of: coating diffusion heat treatment and precipitation heat treatment.

2. The method of claim 1, wherein the component is a component of a gas turbine.

3. The method of claim 1, wherein the third heat treatment comprises both coating diffusion heat treatment and precipitation heat treatment.

4. The method of claim 3, wherein the mechanically treating of the component comprises shot peening of at least one cooling channel defined in the component.

5. The method of claim 3, wherein the component is a gas turbine blade.

6. The method of claim 5, wherein the coating is applied onto an airfoil of the gas turbine blade.

7. The method of claim 6, wherein the second heat treatment is a brazing heat treatment.

8. The method of claim 6, wherein the at least one portion of the component that is machined is a portion of a fir tree of the gas turbine blade.

9. The method of claim 8, wherein the mechanically treating of the component comprises mechanically treating at least one of the fir tree and a cooling channel of the gas turbine blade.

10. The method of claim 8, wherein the third heat treatment heats the component to a temperature below a gamma prime solvus temperature of the component.

11. The method of claim 1, wherein the component is a gas turbine blade and the coating is applied onto an airfoil of the gas turbine blade.

12. The method of claim 1, wherein the machining and the mechanically treating of the component affects a surface of the component and the second heat treatment modifies a microstructure of the surface affected by the machining and the mechanically treating.

13. The method of claim 1, wherein the third heat treatment heats the component to a temperature below a gamma prime solvus temperature of the component.

* * * * *